United States Patent
Hematy et al.

(10) Patent No.: US 9,148,147 B2
(45) Date of Patent: Sep. 29, 2015

(54) PROGRAMMABLE MIXED-SIGNAL INPUT/OUTPUT (IO)

(71) Applicant: Maxim Integrated Products, Inc., San Jose, CA (US)

(72) Inventors: Arman Hematy, San Jose, CA (US); Martin Mason, San Jose, CA (US); Pierre Haubursin, Cupertino, CA (US); Patrick Chan, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 31 days.

(21) Appl. No.: 14/190,311

(22) Filed: Feb. 26, 2014

(65) Prior Publication Data

US 2014/0354328 A1 Dec. 4, 2014

Related U.S. Application Data (60) Provisional application No. 61/830,206, filed on Jun. 3, 2013.

(51) Int. Cl.
- *H01L 25/00* (2006.01)
- *H03K 19/0175* (2006.01)
- *H03M 1/00* (2006.01)

(52) U.S. Cl.
CPC ......... *H03K 19/017581* (2013.01); *H03M 1/00* (2013.01)

(58) Field of Classification Search
None
See application file for complete search history.

(56) References Cited

U.S. PATENT DOCUMENTS

| | | | | |
|---|---|---|---|---|
| 6,055,145 | A * | 4/2000 | Lagree et al. | 361/93.1 |
| 6,516,204 | B1 * | 2/2003 | Funk et al. | 455/557 |
| 6,744,376 | B1 * | 6/2004 | Pascalidis | 340/870.21 |
| 7,308,608 | B1 * | 12/2007 | Pleis et al. | 714/30 |
| 7,622,950 | B2 * | 11/2009 | Krah et al. | 326/41 |
| 8,145,856 | B1 * | 3/2012 | Rosen | 711/154 |
| 8,601,254 | B1 * | 12/2013 | Kutz et al. | 713/100 |
| 8,908,701 | B2 * | 12/2014 | Klein | 370/401 |
| 2003/0046622 | A1 * | 3/2003 | Whetsel | 714/724 |
| 2005/0226446 | A1 * | 10/2005 | Luo et al. | 381/312 |
| 2005/0264299 | A1 * | 12/2005 | Manani et al. | 324/539 |
| 2006/0191401 | A1 * | 8/2006 | Ueshima et al. | 84/724 |
| 2012/0294473 | A1 * | 11/2012 | Pierce et al. | 381/396 |
| 2013/0088246 | A1 * | 4/2013 | Lundstrum et al. | 324/686 |

OTHER PUBLICATIONS

Texas Instruments; 12-Bit Analog Monitoring and Control Solution with Multichannel ADC, DACs, and Temperature Sensors; Jan. 2011—Revised Sep. 2013; pp. 1-92.

\* cited by examiner

*Primary Examiner* — Crystal L Hammond
(74) *Attorney, Agent, or Firm* — Advent, LLP (57) ABSTRACT

Techniques are described for providing highly integrated and configurable IO ports for integrated circuits that can be individually configured for a variety of general purpose digital or analog functions, such as multiple channel analog-to-digital converters (ADC), multiple channel digital-to-analog converters (DAC), multiplexers, GPIOs, analog switches, switch and multiplexers, digital logic level translators, comparators, temperature sensors and relays, and so forth. The configurations of individual ports can be set by a configuration register that can, for instance, designate the function and voltage range of the port without impacting the other ports. In embodiments, logic mapping of a port order sequence can be defined. A data register can also be included for handling microcontroller commands and storing conversion results from, for instance, a port functioning as an ADC input port. These capabilities can be combined with its multi-range, high voltage and high current capability to increase functionality.

20 Claims, 10 Drawing Sheets

PROGRAMMABLE MIXED-SIGNAL INPUT/OUTPUT (IO)

CROSS-REFERENCE TO RELATED APPLICATIONS

The present application claims the benefit under 35 U.S.C. §119(e) of U.S. Provisional Application Ser. No. 61/830,206, filed Jun. 3, 2013, and titled "PROGRAMMABLE MIXED-SIGNAL INPUT/OUTPUT (I/O)," which is herein incorporated by reference in its entirety.

BACKGROUND

Designing integrated circuits is a very complex and time consuming process. Engineers spend large amounts of time configuring the integrated circuit's architecture so it functions properly for its intended purpose. While this time, effort, and expense are acceptable for application specific integrated circuits (ASIC) that will be produced in large quantities, at times designing integrated circuits for a particular purpose is not practical or cost efficient. For some applications, as a result, accommodating the desired functions results in a complex and inefficient solution for the customer.

Integrated circuits for control and automation applications, for example, are very complex because they are capable of processing a large number of functions. Such integrated circuits are used extensively in the communications, industrial automation and medical device fields. Integrated circuits for these applications often implement large numbers of ports to support multiple channel analog-to-digital converters (ADC), multiple channel digital-to-analog converters (DAC), general purpose input/output devices (GPIO), comparators, temperature sensors, multiplexers, relays, or the like. As a result, these integrated circuits can become quite large. Consequently, many implementations use multiple integrated circuits instead of a single integrated circuit wherein each integrated circuit performs a limited set of functions.

SUMMARY

Techniques are described for providing highly integrated and configurable input/output (JO) ports for integrated circuits that can be individually configured for a variety of general purpose digital or analog functions, such as multiple channel analog-to-digital converters (ADC), multiple channel digital-to-analog converters (DAC), multiplexers, general purpose input/output devices (GPIO), analog switches, switches and multiplexers, digital logic level translators, comparators, temperature sensors and relays, and so forth. The individual configuration of ports of the configurable IO can be set by a configuration register that can, for example, designate the function and voltage range of the port without impacting the other ports. In embodiments, logic mapping of a port order sequence can also be defined. A data register can be included for storing a conversion result from, for example, a port functioning as an ADC input port. These capabilities can be combined with multi-range, high voltage and high current capability to provide versatile functionality to the integrated circuit.

This Summary is provided solely to introduce subject matter that is fully described in the Detailed Description and Drawings. Accordingly, the Summary should not be considered to describe essential features nor be used to determine scope of the claims.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Integrated circuit designs for automation and control are often large and complex because these applications use a large number of IO ports to support different functions e.g., multiplexing, digital-to-analog conversion, and so forth. As a result, manufacturers of products in these fields sometimes accept chips that are bulky, or have ports that are not used. Moreover, such manufacturers often employ multiple chips to accommodate the selected functionality. The latter approach consumes more power in comparison to a single chip and may be more difficult to integrate into a product.

Accordingly, techniques, integrated circuits and methods are described for providing highly integrated IO ports that can be separately configured for analog input, analog output, digital input, digital output, and general purpose use. The port's configuration can be set using an on-chip register to select the port's functionality. The ports are configurable to support general purpose analog digital functions including multiple channel analog-to-digital converters (ADC), multiple channel digital-to-analog converters (DAC), multiplexers, GPIOs, analog switches, switches and multiplexers, digital logic level translators, comparators, temperature sensors and relays.

EXAMPLE

Integrated Circuit

Figure 1:
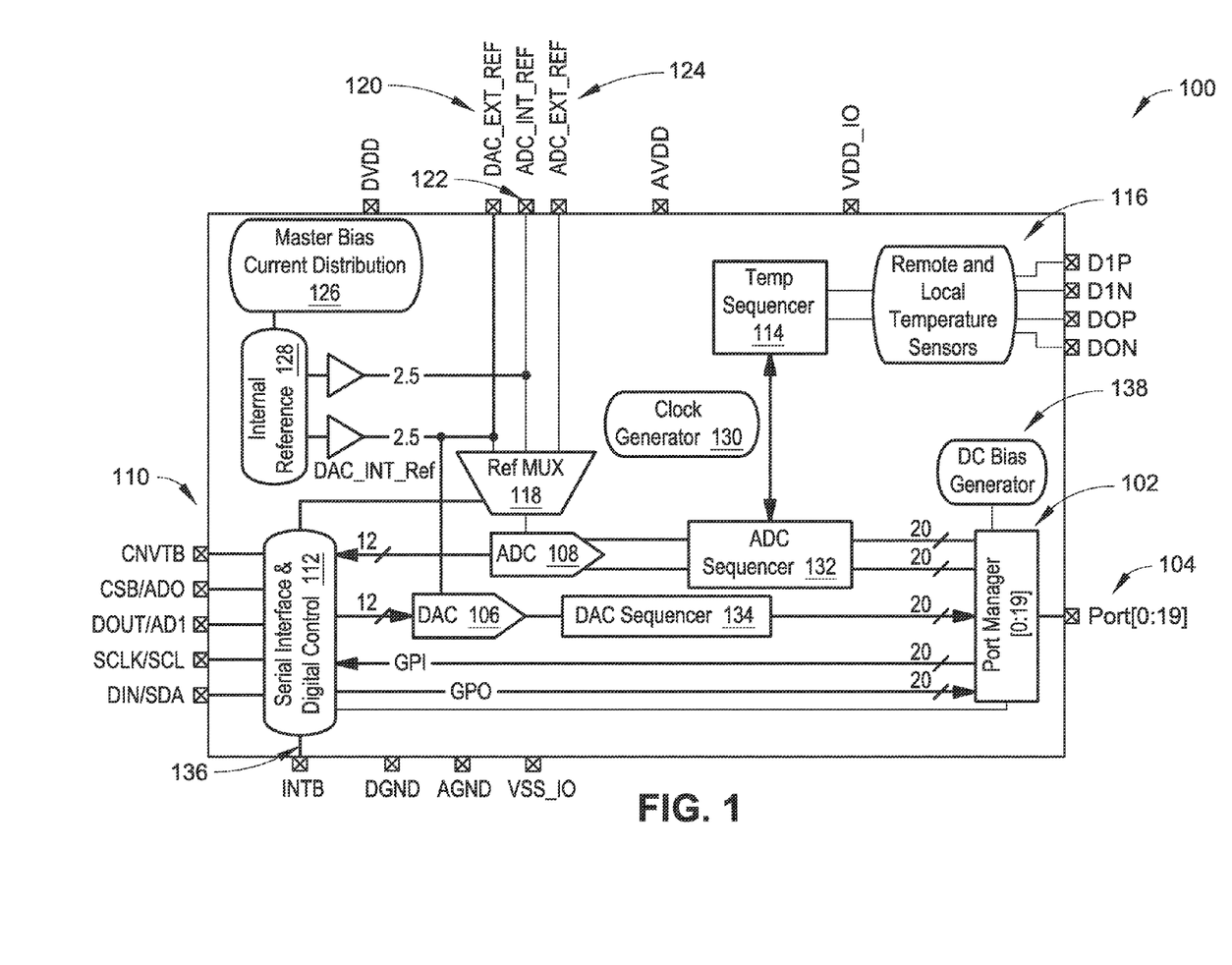
FIG. 1 is a diagrammatic illustration of an integrated circuit in accordance with example implementations of the present disclosure.

FIG. 1 illustrates an integrated circuit 100 in accordance with embodiments of the present disclosure. Although the integrated circuit 100 can be used or configured for a variety of purposes, in embodiments, the integrated circuit 100 is configured for inclusion in a device used in an automation process, used for power supply thermal management, used for power amplification biasing, and so on.

As illustrated, the integrated circuit 100 includes a port manager 102 configuring a plurality of ports that are configurable. For example, the port manager 102 is illustrated as configuring twenty (20) ports 104 that are independently configurable. For purpose of convenience only, the 20 ports are identified as Port[0:19]. Individual ports will be referred to according to the convention Port01, Port02, Port03 and so forth. Thus, any one of the port's configuration can be set without regard for the configuration of the other ports 104 configured by the port manager 102. For example, Port01 can be set without consideration as to the configuration of any of the other remaining ports (e.g., Port02, Port03, Port04, etc.) 104. Although a twenty (20) port configuration is described, it is to be appreciated that the number and configuration of the ports can be varied based on intended use of the chip, customer specifications and the like.

Individual ports 104 can be used for a variety of general purpose analog or digital functions. For example, Port01 can be used for transmitting DAC output independent of the signal being carried by any of the other ports 104 configured by the port manager 102. The remaining ports 104 configured by the port manager 102 are likewise configurable without regard for how Port01 is set.

The ports 104 can be used to support general purpose analog or digital functions. For example, any one of the ports 104 configured by the port manager 102 can support a DAC 106 without impacting whether or not any of the other ports 104 included in the plurality of ports 104 can be set to communicate a DAC output or any of the other functions. In this manner, a customer (e.g., a manufacturer) can set the functions of the ports 104 via a register rather than having a fixed configuration imposed due to integrated circuit design. This ability can save board space, eliminate unused ports (e.g., ports that are ill-configured in comparison to the customer's specification), and so forth.

With reference to FIG. 1, configuration of the ports 104 can be set using a register included in suitable memory. In embodiments, the register is composed of a configuration register (e.g., a personality register) and a data register. The configuration register sets, for example, the port's function and its voltage range. For example, the register can set the ports 104 to support functions including, but not limited to: analog-to-digital conversion, digital-to-analog conversion, a general purpose input (GPI), a general purpose output (GPO), a multiplexer or comparator, or an analog switch. Example voltage ranges include positive, negative or bi-polar. Sample voltage ranges can be zero to ten volts (0V to 10V), negative five to positive five volts (−5V to +5V) and minus ten to zero volts (−10V to 0V). Although the voltage ranges and function of the ports 104 can be set/reset, in embodiments, these voltage ranges may be set by a customer or like user. Thus, upon initial power-up, the ports 104 are not configured (e.g., set to a high impedance state or High-Z) so that when the customer sets the register, the function and voltage range are assigned to the port through the configuration register. The configuration register's settings can be programmed using software. Although the DAC 106 and an ADC 108 are illustrated as having, respectively, a twelve (12) bit output and a twelve (12) bit input (so as to function as a twelve (12) bit servo loop for temperature monitoring and other system functions), other configurations are also contemplated.

In embodiments, a variety of memory devices can be used to hold the configuration register. Sample memory devices include D flip flop, Static Random Access Memory (SRAM), other non-volatile memory, and so forth. This memory can be integrated in any of the structures on the integrated circuit 100.

The data register sets the voltage at which, for instance the DAC 106 is driving. For example, Port03 is set to support the DAC 106 with a voltage range of zero to ten volts (0-10 V) in the configuration register. In operation, the DAC 106 drives Port03 at three and one half volts (3.5V) based on input from a microcontroller. In an example, a microcontroller sets the voltage at which the DAC 106 output is driving by writing it to the data register via a microcontroller interface 110 and a serial interface and digital control 112. The microcontroller may do this, for example, as part of overseeing power supply thermal management using a temperature sequencer 114 and one or more temperature sensors (collectively Remote and Local Temperature Sensors 116).

The foregoing power supply thermal management example is provided solely for illustrative purposes and is not intended to limit the embodiment illustrated in FIG. 1. It is to be appreciated that in this embodiment the integrated circuit 100 functions as a slave for the microcontroller.

The microcontroller interface 110 can be configured to have a variety of configurations. Example microcontroller interfaces 110 include, but are not necessarily limited to: a Serial Peripheral Interface (SPI) or an I$^2$C interface (I-squared-C) interface. Thus, in an example in which the DAC 106 drives Port03 at 3.5V in an I$^2$C interface, the SCL and SDA ports are used and the AD1 and AD0 ports are used to the address for I$^2$C to identify a unique identification for the integrated circuit 100, such as in a multiple chip situation. In contrast, for a SPI interface the CSB, DOUT, SCLK and DIN are used to perform the write operation.

The configuration register can be used for logical to physical mapping. Where, for example, physical ports Port01, Port03, and Port05 are set as DAC-configured ports, the register may set virtual addresses for those ports as DAC 1, 2 and 3. This virtual addressing can be used in time sequencing the ports. In this way, the sequencer only goes around to the ports that correspond to the function it is sequencing.

The DAC 106 and the ADC 108 are communicatively coupled to the plurality of ports 104. The ADC 108 and the DAC 106, in embodiments, are separately coupled to the individual ports configured by the port manager 102 and to the serial interface and digital control 112. Thus, each port is separately connected to both the DAC 106 and ADC 108. As illustrated, the DAC 106 is coupled by a single communication line per port, while the ADC 108 can be coupled by one or two lines per port depending on configuration.

In embodiments, single DAC 106 and a single ADC 108 are implemented for the ports configured by the port manager 102. The use of a single DAC 106 and a single ADC 108 permit time-multiplexing of the signals. In this manner, the configurations of individual ports by the port manager 102 are set by the configuration register and time-multiplex to provide flexibility in assigning functions to the port.

The reference multiplex signal is coupled, respectively, to a DAC external reference 120, an ADC internal reference 122, and an ADC external reference 124. The reference multiplexer 118 and DAC 106 can also be connected by a DAC Internal reference from the internal reference 128. The DAC external reference 120, the ADC internal reference 122, and the ADC external reference 124 can be coupled using separate ports to communicate the individual signals. In embodiments, the voltages of the DAC external reference 120 and the ADC external reference 124 can be varied to adjust the voltages at which the related ports configured by the port manager 102 are driven.

As illustrated in FIG. 1, the integrated circuit 100 includes a master bias 126 for establishing predetermined current/voltages to an internal reference 128. The internal reference 128 is coupled to the DAC 106, the Ref Mux 118 to establish the/voltage for the DAC reference 120 and the ADC internal reference 122.

The integrated circuit 100, as shown, also includes a clock generator 130. The clock generator 130 is used as a clock source for the entire integrated circuit 100.

The ADC sequencer 132, as illustrated, is included between the ADC 108 and the ports configured by the port manager 102. The ADC sequencer 132 sequences the ports that have ADC functionality (e.g., for purposes of illustration only, physical ports Port01, Port03 and Port05). The ADC sequencer 132 can perform this sequencing in a variety of ways. For example, the ADC sequencer 132 can schedule ADC conversions from the lowest virtual address to the highest virtual address, and write the conversion results into the respective data registers. Then the ADC sequencer 132 stops. The ADC sequencer 132, in another mode, can perform an infinite loop in which it loops around the ADC-configured ports indefinitely converting and writing the conversion results into the data registers. The ADC sequencer 132, in a further mode, can convert a port multiple times and then write the average conversion result to the respective data register. For example, the ADC sequencer 132 can be configured to do ADC conversion at Port01 eight times, at Port03 three times, and at Port05 two times, and for each of those port reports, write the average value in the data register.

The DAC sequencer 134, as shown in the embodiment of FIG. 1, is included between the DAC 106 and the port manager 102 for sequencing the DAC output in a timed-multiplexed manner. In this way, different outputs can be distributed to the ports 104 according to the register settings. Thus, an individual port's configuration is independent of the configuration of the other ports since its signal is based on timed-multiplexing rather than being defined by physical architecture. The DAC sequencer 134, in embodiments, sequences the output in a timed manner thus permitting sharing of a single DAC 106. For example, a track and hold function is used to set the port value that is held at the voltage until the port is sequenced again.

In embodiments where the integrated circuit is configured for thermal monitoring and control, a temperature sequencer 114 and one or more temperature sensors (collectively 116) can be included in the integrated circuit 100. The temperature sensors 116 represent sensors that can be used to monitor temperature to prevent overheating of a power supply or other component. Individual sensors can be on-chip sensors, or be coupled by ports for remote sensing. In this configuration, the integrated circuit could function as a servo loop for temperature management.

The port manager 102, as illustrated in FIG. 1, also includes communication lines between the port manager 102 and the serial interface and digital control 112 for GPIO ports. As illustrated, the leads include twenty general-purpose in and twenty general-purpose out communication lines to permit any one of the ports to function as a general purpose input or output. It is to be appreciated that the number of leads can vary based on the number of ports configured by the port manager 102.

An interrupt line 136 is also shown. Interrupt is used when some event happens in the chip (such as the temperature going above a set temperature or a port being over current). In this instance, the interrupt port can change, such as from 1 to 0, which is then put into an interrupt register. The microcontroller can check the interrupt register and resolve the event. An interrupt mask can be used to mask or hide events that occur but do not require microcontroller attention.

With continued reference to FIG. 1, the integrated circuit 100 also includes a bias generator 138 coupled to the port manager 102. The bias generator 138 biases the individual ports configured by the port manager 102 to establish a steady offset voltage for the individual ports.

Figure 2:
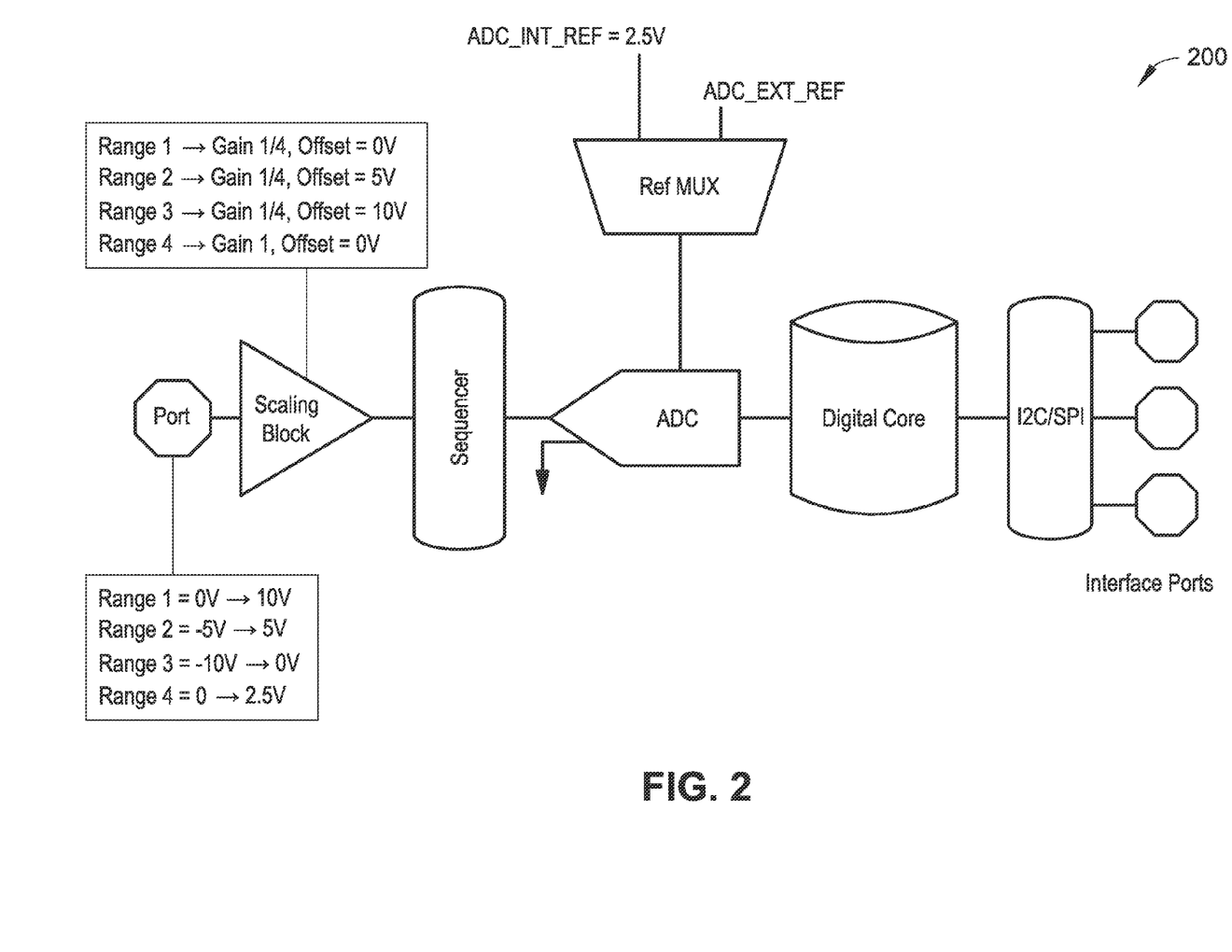
FIG. 2 is a diagrammatic illustration of an ADC-configured port functioning as a single ended ADC input in accordance with example implementations of the present disclosure.

FIG. 2 generally illustrates an embodiment 200 in which an ADC-configured port functions as a single ended ADC input. The embodiment 200 of FIG. 2 includes sample voltage ranges for the port and the scaling block's scale selections. While a user can change an external reference, e.g. use the external reference port, the internal reference is set to 2.5V, e.g., the ADC_INT_REF is 2.5V. In the illustrated example, the port can function as an analog input to the single ended ADC. The port is capable of implementing a variety of input ranges with an internal or external reference voltage. As with the embodiment of FIG. 1 a microcontroller can be coupled via a SPI or I$^2$C interface.

Figure 3:
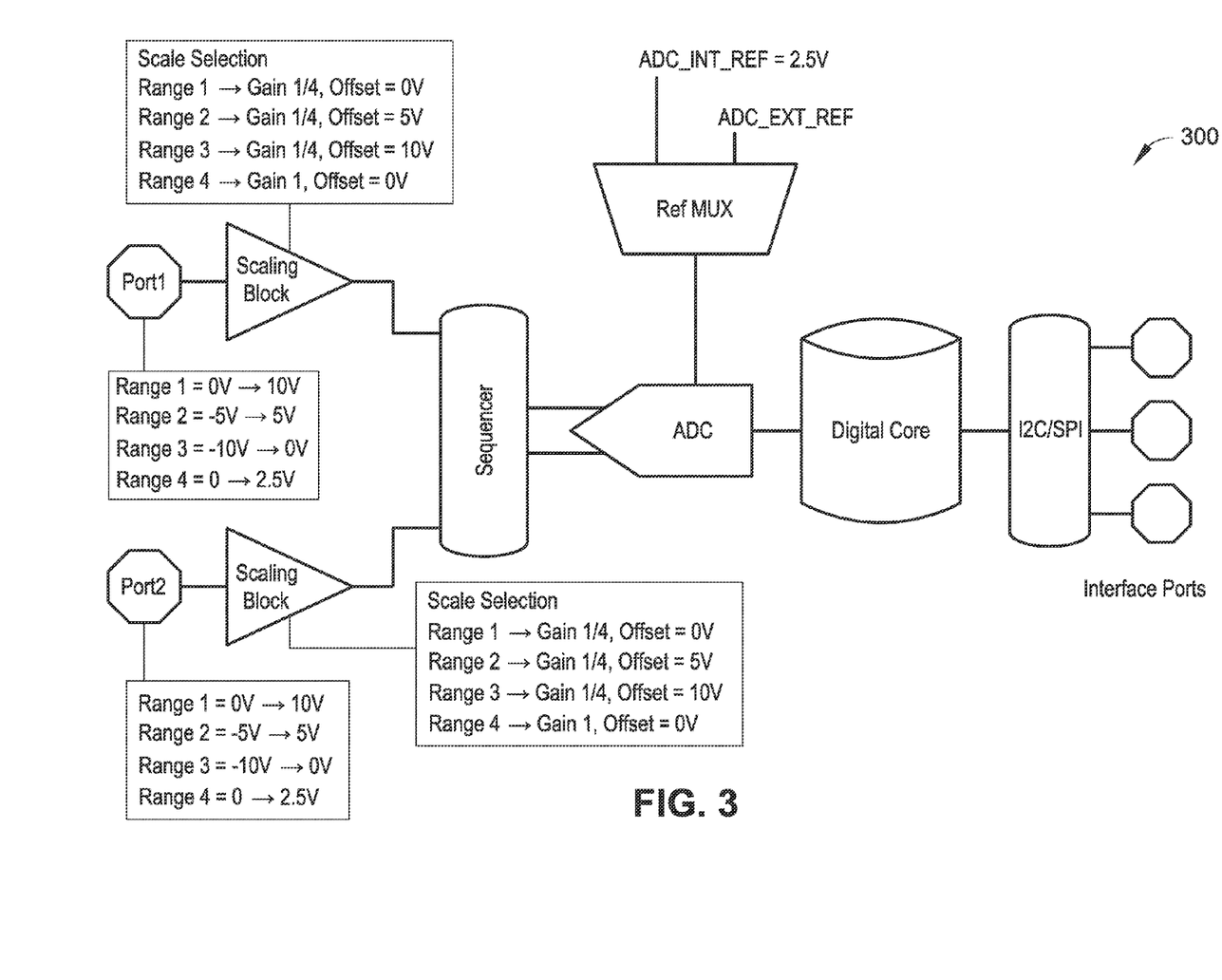
FIG. 3 is a diagrammatic illustration in which two ports are configured to function as differential ADC inputs in accordance with example implementations of the present disclosure.

FIG. 3 generally illustrates an embodiment 300 in which two ports are configured to function as differential ADC inputs. Although ports 1 and 2 are referenced, any two ports can be configured to provide this function. The ports are capable of implementing a variety of input ranges and selecting an internal or external reference voltage. As with the embodiment of FIG. 1, a microcontroller can be coupled via a SPI or I$^2$C interface.

Figure 4A:
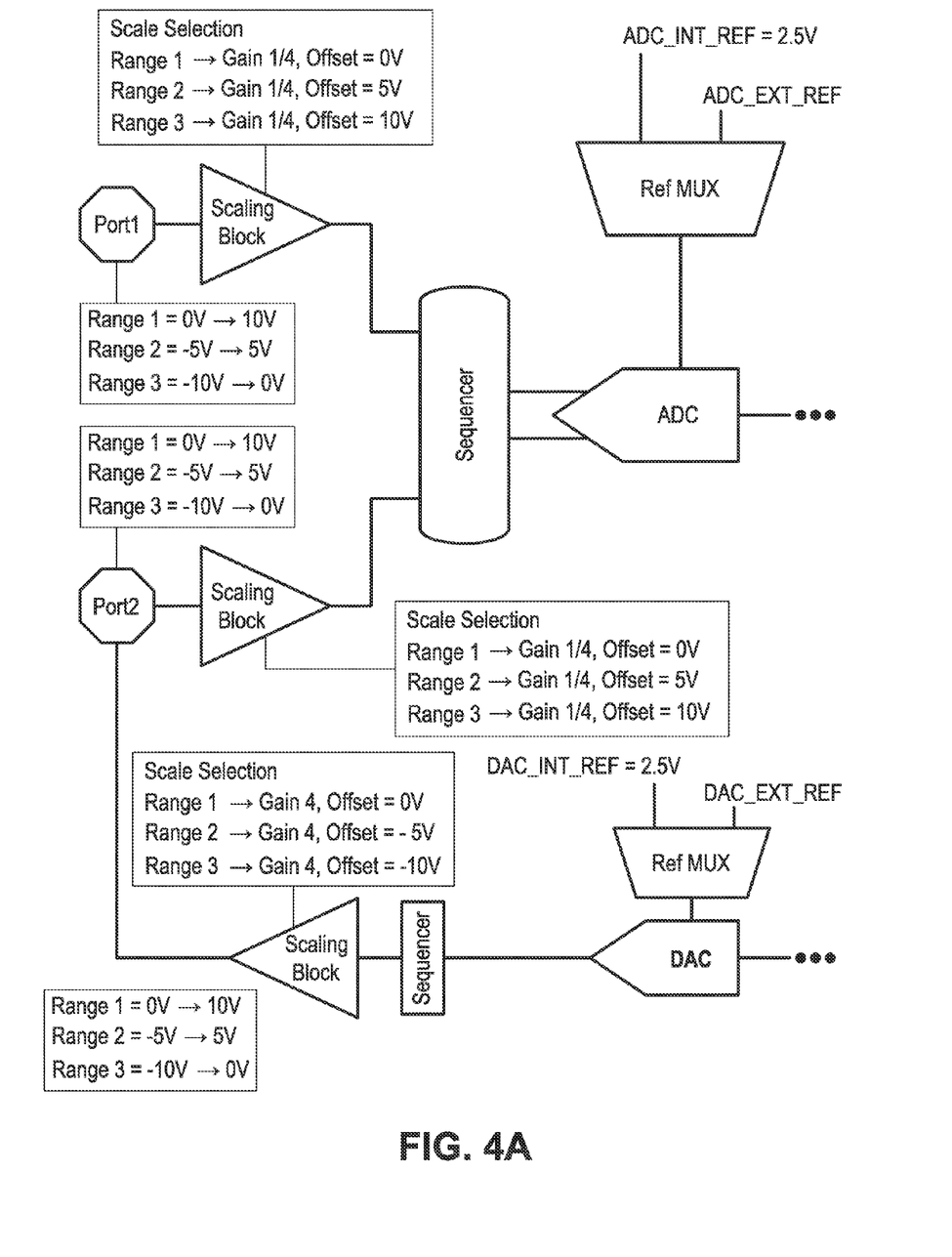
FIGS. 4A and 4B are a diagrammatic illustration in which two ports are configured to function as pseudo differential ADC inputs in accordance with example implementations of the present disclosure.
Figure 4B:
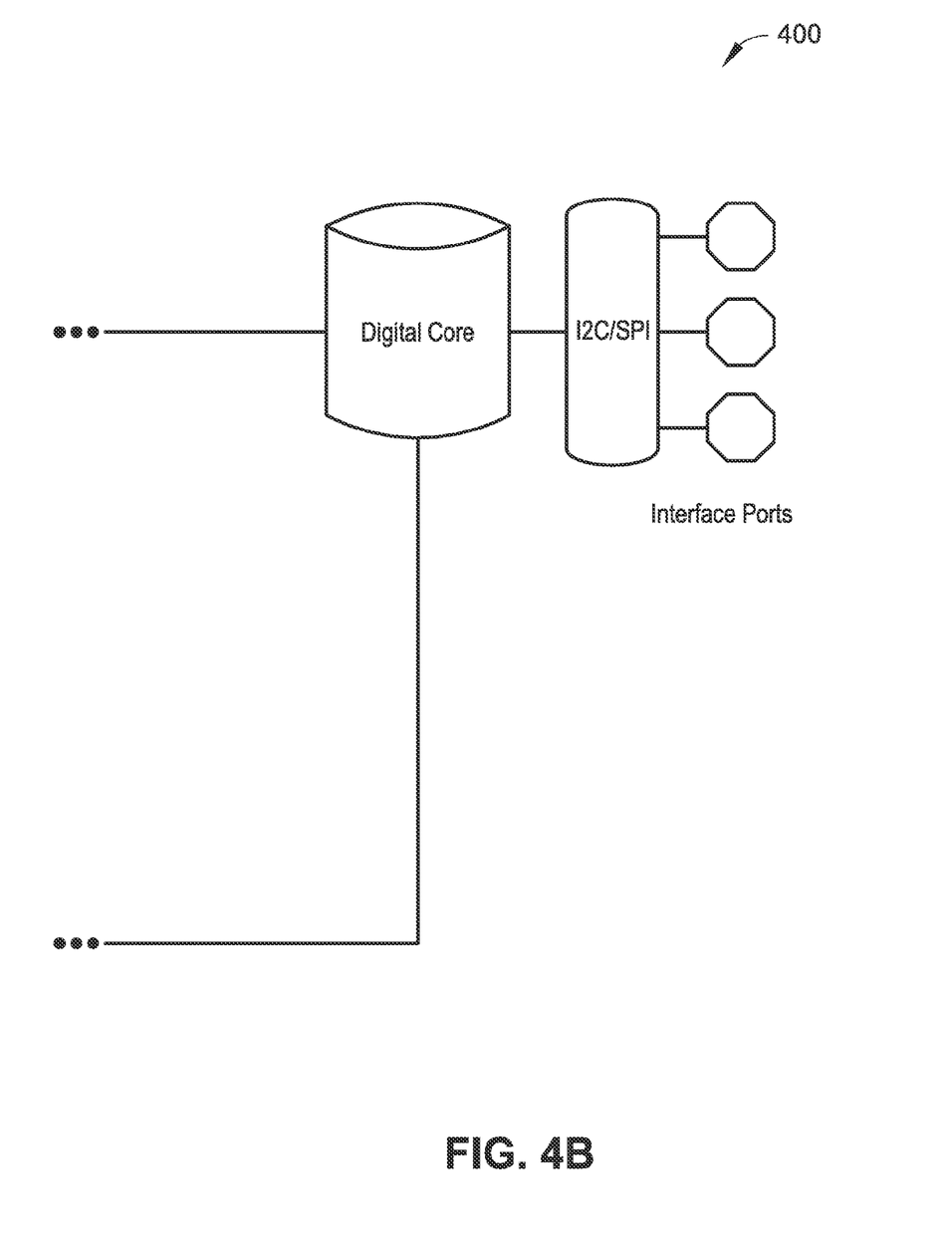

FIGS. 4A and 4B generally illustrate an embodiment 400 in which two ports are configured to function as pseudo differential ADC inputs. Although ports 1 and 2 are referenced, any two ports which may be configured by a port manager, such as port manager 102, can be configured to provide this function. The ports are capable of implementing a variety of input ranges with an internal or external reference voltage. The ADC inputs can share a common DC bias point. A microcontroller can be coupled via a SPI or I$^2$C interface.

Figure 5:
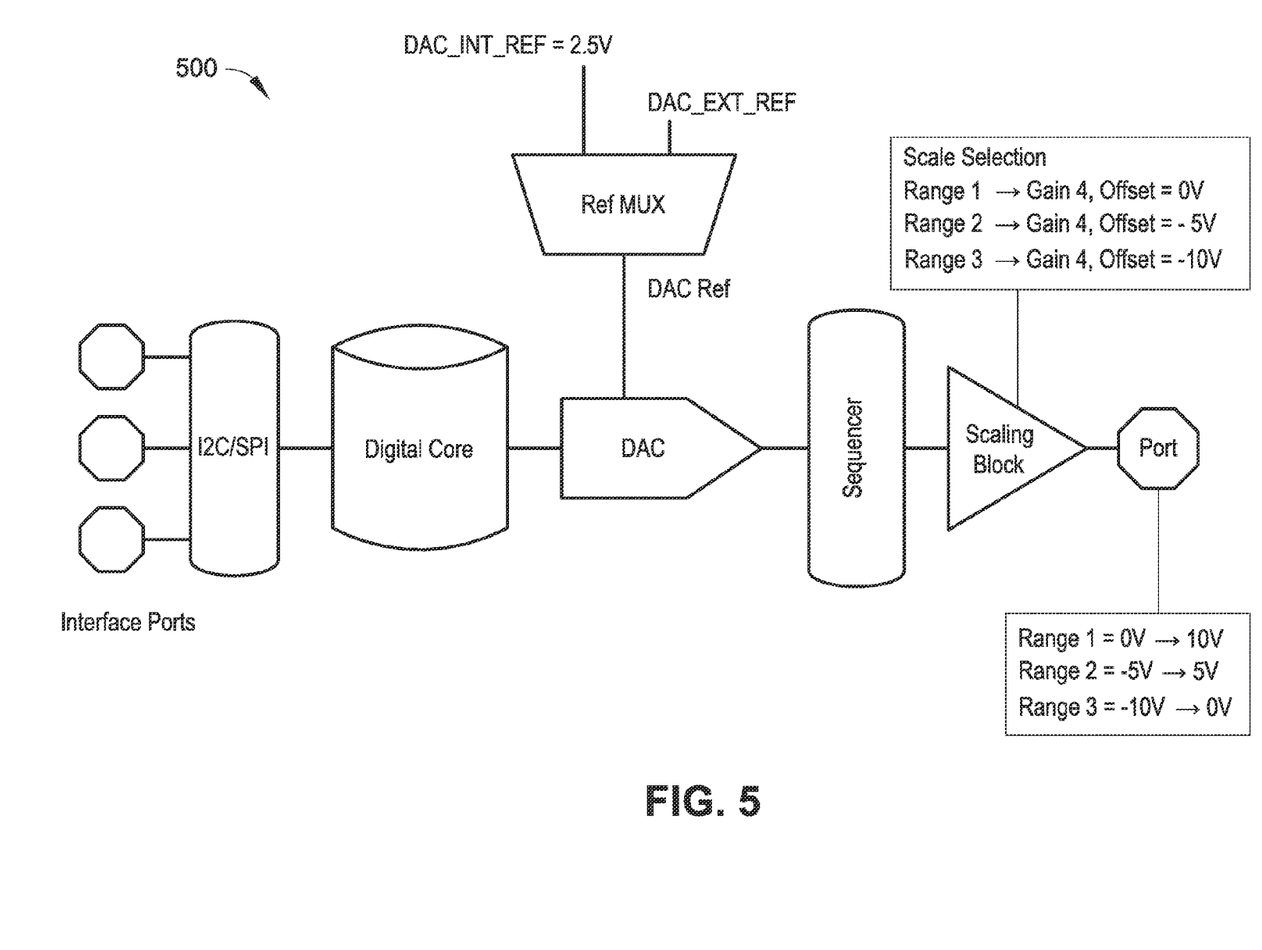
FIG. 5 is a diagrammatic illustration in which a port is configured to function as an analog DAC output in accordance with example implementations of the present disclosure.

FIG. 5 generally illustrates an embodiment 500 in which a port is configured to function as an analog DAC output. The DAC can, for instance, drive the port at 25 mA and current limit to 50 mA. The ports can be configured to operate in three ranges, such as 0V to 10V, −5V to +5V or −10V to 0V.

Figure 6:
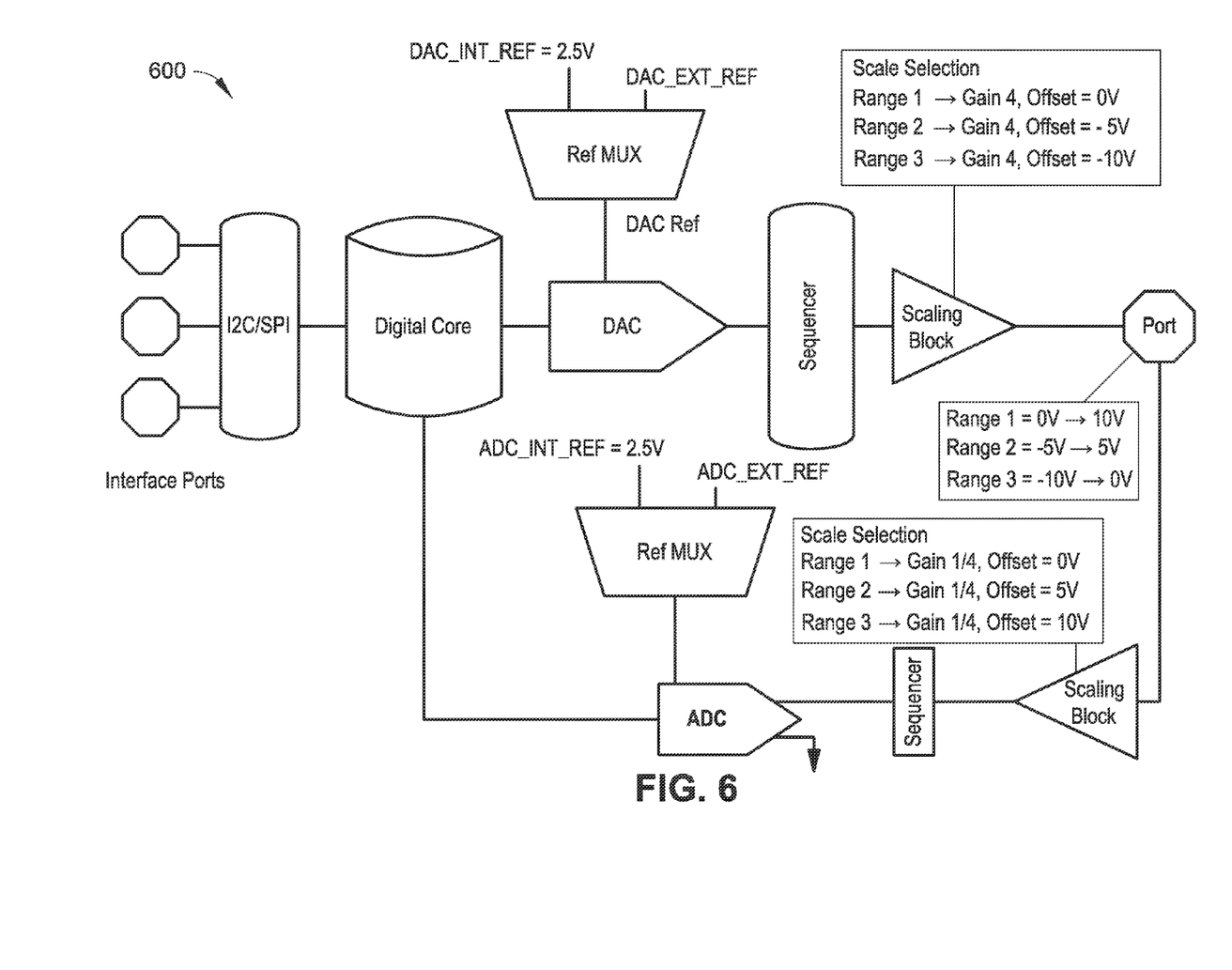
FIG. 6 is a diagrammatic illustration in which a port is configured to function as an analog DAC output with ADC read back functionality in accordance with example implementations of the present disclosure.

FIG. 6 generally illustrates an embodiment 600 in which a port is configured to function as an analog DAC output with ADC read back functionality. In the illustrated embodiment, the DAC and the ADC can be set to the same reference voltage. This configuration can be used to provide correction and calibration via the ADC.

Figure 7:
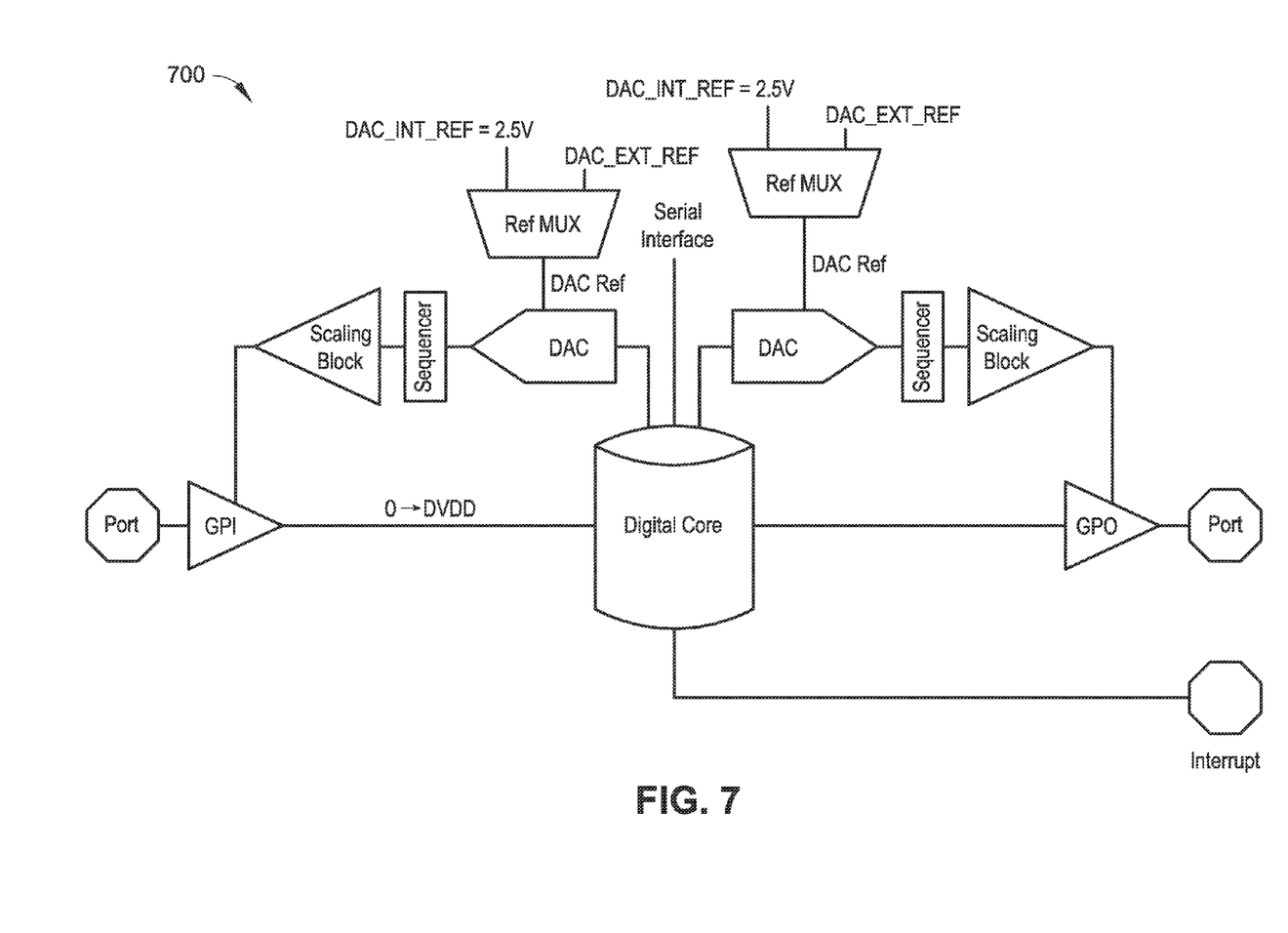
FIG. 7 is a diagrammatic illustration in which two ports provide GPIO and unidirectional logic level translation with an interrupt port in accordance with example implementations of the present disclosure.

FIG. 7 generally illustrates an embodiment 700 in which two ports provide GPIO and unidirectional logic level translation with an interrupt port. Any two ports configured by the port manager can function in this configuration. The GPI, as illustrated, can experience ±30 mV hysteresis in embodiments. The GPI input threshold voltage can be programmed through the microcontroller. The GPO has a current limit of 50 mA and the logic one level produced by the GPO can be programmed through the microcontroller. The function is not clocked and the GPO function can change substantially immediately with a change in GPI activity. GPO output and GPI input can be inverted as well.

It is to be appreciated that while the integrated circuit 100 has been described with some level of specificity, that various changes or modifications may be made based on the particular implementation that is selected. For example, while the integrated circuit 100 is described as a slave, in further embodiments functionality can be included in the integrated circuit, to some extent, to provide some level of autonomy. It is the intent of this description to encompass and include such modifications. While various embodiments are described it is to be apparent that other configurations are possible. For example, two ports can be configured as bi-directional logic level translators. In this embodiment, two adjacent ports are used as bi-directional logic level translators for any open drain logic driver. In this embodiment, external pull-up resistors and external logic supplies should be supplied by the user. This function is not clocked so any one of two ports can pull the other port low substantially immediately.

Example Methods

The following describes methods that can be implemented utilizing the above systems, techniques, approaches, architectures, and modules. Aspects of each of these methods may be implemented in hardware, firmware, or software, or a combination thereof. The methods are shown as a set of blocks that specify operations performed and are not necessarily limited to the order shown for performing the operations by the respective blocks. In portions of the following discussion, reference will be made to the integrated circuit 100 of FIG. 1 described above.

Figure 8:
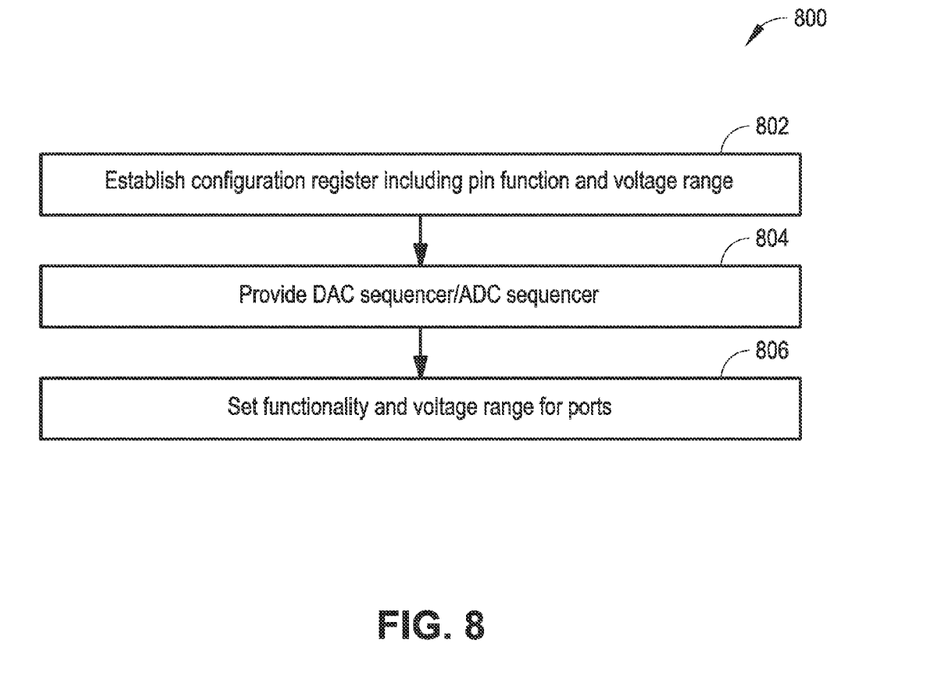
FIG. 8 is a flow diagram illustrating a method of configuring IO ports included in an integrated circuit in accordance with example implementations of the present disclosure.

FIG. 8 depicts a method 800 of configuring IO ports included in an integrated circuit. In embodiments, the ports can be configured without regard to the configuration of other ports. Thus, the individual ports' general purpose analog or digital function is not limited to particular port configurations.

As illustrated, a register is established (Block 802). For example, a configuration register is established in memory to hold configuration or personality data for the ports configured by the port manager. Configuration data can include the port's function, logical address, voltage range and so forth. In the illustrated embodiment, establishing a register includes establishing a data register in volatile memory, such as for holding reads from ADC-configured ports and DAC output voltage settings associated with DAC-configured output ports.

ADC and DAC sequencers are provided (Block 804). In embodiments, the ADC and DAC sequencers support a single DAC and single ADC for the ports configured by the port manager. The DAC and ADC sequencers permit the single DAC and single ADC to time-multiplex to each of the 10 ports configured by the port manager.

Configuration settings are written to the configuration register (Block 806). For example, the function and voltage range for the ports can be configured. In this manner the ports can be configured by a customer or other user. The foregoing configuration can promote high integration and flexibility in configuring the ports.

Figure 9:
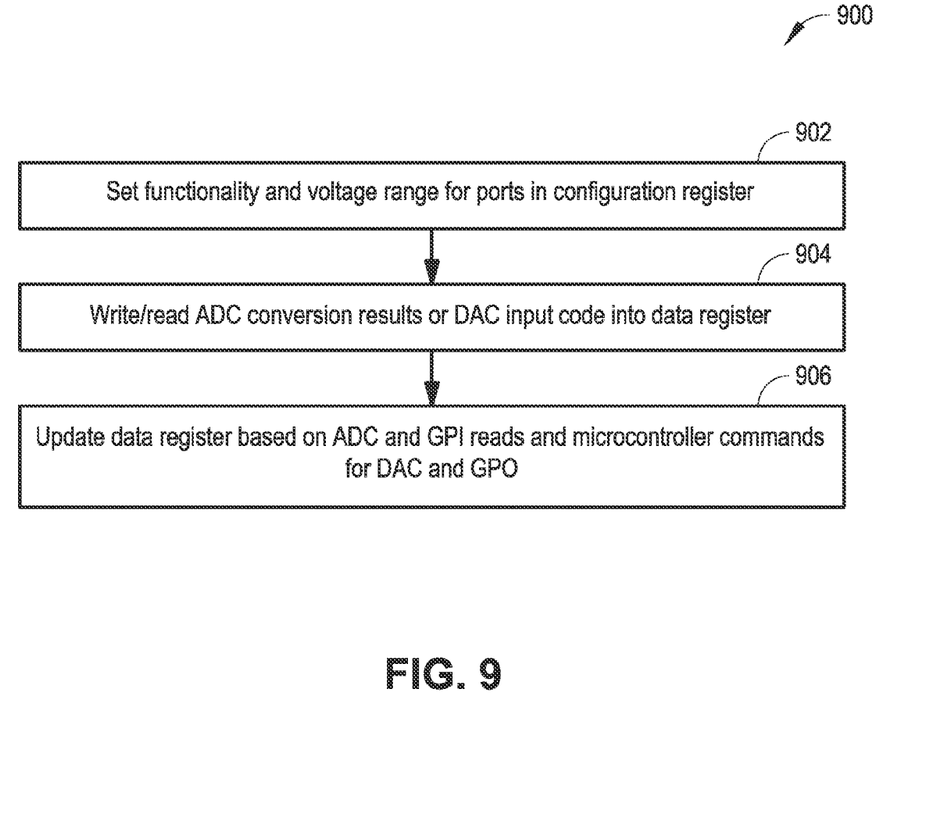
FIG. 9 is a flow diagram illustrating a method of operating an integrated circuit that permits configuration of individual IO ports through use of a register in accordance with example implementations of the present disclosure.

FIG. 9 depicts a method 900 of operating an integrated circuit that is constructed to permit configuration of individual input/output ports through use of a register, such as an integrated circuit that includes configuration and data registers. In this manner, a customer can customize the ports based on the customer's specification. This can minimize the size of the board for the integrated circuit, avoid the use of multiple integrated circuits and minimize non-used ports.

As shown, functions and voltage ranges for the ports are set in a configuration register (Block 902). The general purpose analog digital functions and voltages ranges can be set to memory using software.

ADC conversion results are written to the data register (Block 904). For example, the ADC sequencer can convert the input voltages from the ADC-configured ports and write the conversion results to the data register. A microcontroller can, for example, issue a command that is communicated via the serial interface and digital control to write the DAC output DAC code for a particular port. The DAC then drives the output to that DAC code.

The data register is updated (Block 906). The values included in the data register can be updated based on microcontroller commands, such as to report the local or remote temperature for a temperature sensing operation, or the ADC sequencer can write the conversion result of an ADC into the data register. Thus, the register can be updated based on ADC and GPI reads and microcontroller commands for the DAC and GPO ports.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An integrated circuit device comprising:
a plurality of ports, respective ones of the ports being configurable to function as an input or output to communicate at least one of a digital or analog signal based on an on-chip register setting;
a single analog-to-digital converter that is time-multiplexed to the plurality of ports; and
a single digital-to-analog converter that is time-multiplexed to the plurality of ports.

2. The integrated circuit device as recited in claim 1, wherein respective ones of the plurality of ports are separately configurable.

3. The integrated circuit device as recited in claim 1, wherein respective ones of the plurality of ports are capable of functioning as at least one of an analog in, an analog out, a digital in, or a digital out.

4. The integrated circuit device as recited in claim 1, further comprising a memory configured to store a configuration register that is constructed to store a port configuration setting and a voltage range.

5. The integrated circuit device as recited in claim 4, further comprising a data register stored in volatile memory for storing a DAC code associated with a respective port.

6. The integrated circuit device as recited in claim 4, wherein each port of the plurality of ports is separately configurable to accept a voltage range.

7. The integrated circuit device as recited in claim 1, wherein each port of the plurality of ports is configured for a general purpose analog or digital function.

8. An integrated circuit device comprising:
a port manager operable to configure a plurality of ports that are each separately configurable to support either a digital signal or an analog signal in either an input or output configuration;
a single analog-to-digital converter communicatively coupled to the plurality of ports by an analog-to-digital converter sequencer;
a single digital-to-analog converter communicatively coupled to the plurality of ports by a digital-to-analog converter sequencer; and
memory, included on the integrated circuit, for storing a register that is configured to accept user selection of a sequence used by at least one of the analog-to-digital converter sequencer or the digital-to-analog converter sequencer.

9. The integrated circuit device as recited in claim 8, wherein the single analog-to-digital converter and the single digital-to-analog converter, respectively, are the only analog-to-digital converter and the only digital-to-analog converter communicatively coupled to the port.

10. The integrated circuit device as recited in claim 8, wherein each port of the plurality of ports is configurable to function as general purpose analog or digital function.

11. The integrated circuit device as recited in claim 10, wherein a general purpose analog or digital function is at least one of multiple channel analog-to-digital converters (ADC), multiple channel digital-to-analog converters (DAC), multiplexers, GPIOs, analog switch, switch and multiplexer, digital logic level translators, comparators, temperature sensors and relays.

12. The integrated circuit device as recited in claim 8, further comprising volatile memory configured to contain a data register that is constructed to contain ADC conversion results associated with each of the ports in the plurality of ports.

13. The electronic device as recited in claim 8, wherein each port of the plurality of ports is originally set in high impedance mode (High-Z).

14. An integrated circuit device comprising:
a port manager operable to configure a plurality of ports that are each separately configurable to support either a digital signal or an analog signal in either an input or output configuration;
an analog-to-digital converter communicatively coupled to the plurality of ports by an analog-to-digital converter sequencer;
a digital-to-analog converter communicatively coupled to the plurality of ports by a digital-to-analog converter sequencer; and
memory, included on the integrated circuit, for storing a register that is configured to accept user selection of a sequence used by at least one of the analog-to-digital converter sequencer or the digital-to-analog converter sequencer.

15. The integrated circuit device as recited in claim 14, wherein respective ones of the plurality of ports are separately configurable.

16. The integrated circuit device as recited in claim 14, wherein respective ones of the plurality of ports are capable of functioning as at least one of an analog in, an analog out, a digital in, or a digital out.

17. The integrated circuit device as recited in claim 14, wherein the register comprises a configuration register that is constructed to store a port configuration setting and a voltage range.

18. The integrated circuit device as recited in claim 17, wherein the register further comprises a data register for storing a conversion result associated with a respective port.

19. The integrated circuit device as recited in claim 18, wherein each port of the plurality of ports is separately configurable to accept a voltage range.

20. The integrated circuit device as recited in claim 14, wherein each port of the plurality of ports is configured for a general purpose analog or digital function.

* * * * *